United States Patent
Lim et al.

(10) Patent No.: US 6,940,299 B1
(45) Date of Patent: Sep. 6, 2005

(54) METHOD OF TESTING FOR SHORT CIRCUITS BETWEEN ADJACENT INPUT/OUTPUT PINS OF AN INTEGRATED CIRCUIT

(75) Inventors: Chong Han Lim, Kuala Lumpur (MY); Heng Wai Seng, Bokit Katil (MY); Chee Keong Low, Cheng (MY)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/839,436

(22) Filed: May 4, 2004

(51) Int. Cl.$^7$ ............................................. G01R 31/26
(52) U.S. Cl. ..................................... 324/765; 324/73.1
(58) Field of Search ............................. 324/73.1, 500, 324/512, 522–523, 527–528, 765, 158.1; 365/201; 714/718, 727

(56) References Cited

U.S. PATENT DOCUMENTS 5,513,188 A * 4/1996 Parker et al. ................ 714/727
5,956,280 A * 9/1999 Lawrence .................... 365/201

* cited by examiner

*Primary Examiner*—Minh N. Tang
(74) *Attorney, Agent, or Firm*—Jurgen Vollrath

(57) ABSTRACT

In a method of testing an IC, short circuits between adjacent I/Os are tested by grounding alternate rows in one step, and alternate columns in another step, and, if necessary including a third step of testing any inadequately tested I/Os by identifying inadequately tested I/Os and then testing these. The identifying may include performing an AND operation on the two I/O configurations of the two first steps, the grounded I/Os being defined as logic 0 and the tested I/Os as logic 1. The third step involves grounding all power supply and all ground pins of the IC and testing the remaining I/Os that were inadequately tested in both of the first two steps.

13 Claims, 2 Drawing Sheets

METHOD OF TESTING FOR SHORT CIRCUITS BETWEEN ADJACENT INPUT/OUTPUT PINS OF AN INTEGRATED CIRCUIT

BACKGROUND OF THE INVENTION

In the semiconductor industry, it is common practice to perform certain tests on integrated circuits (ICs) in order to verify the integrity of the ICs. One type of test commonly performed is continuity testing which seeks to identify integrated circuits in which one or more of the pins do not have electrical continuity with the underlying circuit, i.e., there is an open circuit on one or more I/Os. (For ease discussion, the term I/O and pin will be used interchangeably to refer to any input node whether it takes the form of a pin or a ball or a pad or has any other configuration, and irrespective of whether it is a signal input or output or a power supply pin or ground pin.) The continuity test is performed using a test device commonly referred to as ATE, which either sources or sinks current to the pins being tested and provides a return path via one or more ground pins. In the absence of a fault condition, the ATE should detect a voltage at an I/O pin of about one diode drop, i.e. approximately 0.7 V. If, however, there is an open circuit on the I/O, the ATE, which acts like a current source will seek to supply the current (or sink the current) and thus register a substantial increase in voltage at the I/O.

As ICs have grown in function in performance over the years, the I/O count has also increased significantly. As a result different packaging formats have evolved for the ICs, including, for example, multi-row and column inline packages like high-pin-count Leadless Lead-frame Packages (LLP); Ball Grid Arrays (BGA) which are high density packages with I/O pins or contacts in the form of balls arranged in a matrix on the underside of the package, and micro Surface Mount Devices (micro SMD) which do not include a housing or package but include I/O contacts directly on the underside of the exposed die in the form of a matrix.

In order to make the continuity testing of such high I/O count ICs more efficient, one conventional method of testing involves continuity testing in parallel for all pins. This involves supplying current to all pins other than ground pins simultaneously and connecting the ground pins to ground to act as current return.

A high voltage (above or below a predefined level relative to a diode drop) on any of the pins indicates an open circuit and therefore a defective IC.

In fact, the ATE resource can also be used to detect a short circuit on any of the pins. For instance if any pin is internally short circuited, the ATE resource supplying the current would register a drop in voltage. Instead of a diode drop (diode turn on voltage) being measured by the ATE resource, it would measure essentially 0 V at the shorted out pin.

However, if a short occurs between two pins, the situation becomes more difficult. In such a situation, the parallel continuity test described above would be able to detect a defect only if the short causes the I/O voltage to swing away from a typical diode drop voltage. If, however, the short between two I/Os has an insignificant effect on the measured diode drop voltage, the parallel continuity test will not be able to detect the defect.

One approach used in the past to deal with this problem was to make use of other parametric or functional tests. In an IC where there are functional differences between different I/Os, parametric or functional tests can detect shorts to adjacent I/Os. However, such tests often become ineffective as the IC matures and as more layers are added that compound the functionality and make such indirect testing difficult or even impossible. Also, if the functionality or parameters of adjacent I/Os is similar, e.g., if two adjacent I/Os define the output channels of two separate but similar voltage regulators with similar output parameters, a short between the two I/Os may not be detected using such parametric or functional tests.

There is therefore a need for efficiently testing ICs for shorts between adjacent I/Os, especially in high I/O count devices.

SUMMARY OF THE INVENTION

The invention comprises an efficient method of testing for short circuits between adjacent pins or I/Os of an IC by grounding alternate columns of pins or I/Os of an IC and applying current to the other pins that are not ground pins, in a first step, and in a second step grounding alternate rows of pins of the IC and applying current to the pins that are not ground pins, and during both steps checking the voltage on the pins to which current is applied. The voltage on the pins to which current is applied is typically monitored for a low voltage, which may be a predefined low voltage or substantially 0V. For purposes of this application the terms first step and second step, or the order in which they are described in the specification or defined in the claims, are not intended to denote any particular order in which the steps are performed. Also the invention is not limited to these steps but can be preceded or followed by additional steps. Also, for purposes of this application, ground pins refers to internal ground pins for the internal devices on the IC. These ground pins are to be distinguished from the pins that are grounded for testing purposes, which may be any kind of pin, including input or output signal pins, power supply pins and ground pins.

The method may further include a parallel continuity test step for testing the I/Os or pins for internal open circuits or short circuits.

Since ground pins serve as voltage references and are preferably not forced to a higher potential than other I/Os to avoid reverse biasing some internal circuits and potentially causing damage to the IC, all ground pins are preferably grounded.

Furthermore, In order to take account of power supply pins which are typically connected together internally, and to take account of ground pins, which are also typically connected to each other internally, any grounding of a power supply pin or ground pin will result in grounding of all the power supply pins or all the ground pins, respectively. Therefore, whenever any power supply pin is grounded, all other power supply pins will also effectively be grounded. (As mentioned above, all ground pins are preferably grounded during each of the steps since they act as a voltage reference.)

The method may involve defining grounded pins as logic 0 and tested pins as logic 1, and performing an analysis step comprising an AND operation on the pins for the first and second step, to determine which pins cannot be adequately tested for short circuits to adjacent pins or I/Os during the first and second steps. The method may include testing said I/Os or pins that cannot be adequately tested during the first and second steps by forcing any power supply and ground I/O to ground potential and testing the remaining ones of said I/Os that cannot be adequately tested in the first and second steps.

The method may also include a second analysis step, involving defining grounded pins as logic 0 and tested pins as logic 1, and performing an XOR operation on the pins for the third step and the pins of the parallel continuity test step.

For purposes of this application, testing of an I/O means applying a current (sourcing or sinking current) or voltage to the I/O sufficient to turn on a diode.

DETAILED DESCRIPTION OF THE INVENTION

Figure 1:
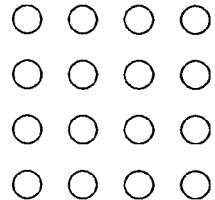
FIGS. 1 and 2 are depictions of a prior art 16 I/O micro SMD IC.
Figure 2:
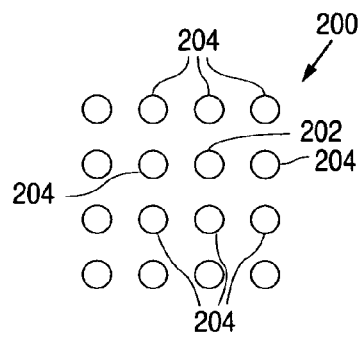

In order to understand the present invention it is useful to consider a simple I/O arrangement of a micro SMD package having 16 I/Os or pins as shown in FIG. 1. Since the I/Os are arranged in a matrix arrangement each such pin or I/O, other than an I/O on the periphery, is surrounded by 8 other I/Os. Therefore, each such I/O can potentially be shorted to any one or more of 8 other I/Os, as shown in FIG. 2, where the I/O 202 in the matrix 200 could be shorted to any one of the surrounding I/Os 204.

One way of testing for a short between any of the pins of the micro SMD package 200 would be to force a ground potential across all the surrounding I/Os 204, and test the I/O 202 for continuity. If there is a short between I/O 202 and any of the I/Os 204, the voltage on the I/O 202 would be at ground instead of registering a diode turn-on voltage. However, this step would only test a single I/O, namely I/O 202. In order to test all of the I/Os in the matrix 200, a similar continuity test would have to be performed on each of the I/Os with respect to their respective surrounding I/Os. Thus the number of tests is a factor of the number of I/Os. This approach is therefore time-consuming, especially in the case of large matrices.

The present invention proposes another way of testing for shorts between any of the pins. While the invention applies not only to micro SMD I/O configurations, a 16 I/O micro SMD will be used for purposes of describing one embodiment of the invention. During testing some pins are grounded and will be denoted in black in the Figures. Other pins will be tested and therefore have a predefined voltage (which is sufficient to turn on a diode) applied to them, and these will be denoted in white in the Figures.

Before testing for any short circuit between adjacent pins, the IC may be tested for internal open circuits or short circuits by making use of a conventional parallel continuity test in which internal ground pins are externally forced to a ground potential and the remaining pins are tested by simultaneously applying voltage to them sufficient to constitute a diode turn-on voltage. If the voltage measured on the tested pin deviates from a diode turn-on voltage by a predefined amount (either higher than a diode turn-on voltage by a predefined amount or lower than a diode turn-on voltage by a predefined amount, which predefined amount may be the same or different from the first predefined amount), one of the I/Os is faulty and the IC is rejected.

The invention then provides for an efficient testing of all of the I/Os of the IC for short circuits with any adjacent I/O. This involves two main steps: a horizontal and diagonal test, and a vertical test and diagonal test. These two main tests may be performed in any order, and as pointed out above, may be preceded by a parallel continuity test. In fact one aspect of the invention is a method of testing not only for short circuits between adjacent pins but also internal open and short circuits. In this aspect of the invention, which includes internal open and short circuit testing, the parallel continuity test forms part of the solution of the invention.

Figure 3:
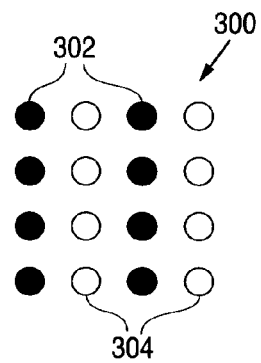
FIGS. 3 and 4 depict two simplified steps of the invention with respect to a micro SMD IC.

The two main steps of the short circuit test between adjacent I/Os will now be described in greater detail. FIG. 3 shows a 16 I/O micro SMD IC 300 in which alternate columns have a ground potential forced across them. These are shown in black and indicated by reference numeral 302. The other I/Os are tested and therefore have a voltage greater than or at least as large as a diode turn-on voltage applied to them. These are shown in white and are indicated by reference numeral 304. It will be appreciated that this setup can detect horizontal and diagonal shorts between the I/Os.

Figure 4:
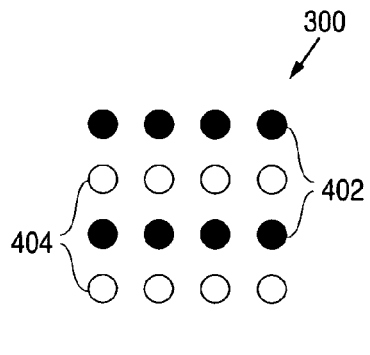

The second main step involves forcing a ground potential across alternate rows of the IC 300 as shown in FIG. 4, where the grounded I/Os are shown in black and depicted by reference numeral 402. The other I/Os are tested and therefore have a voltage greater than or at least equal to a diode turn-on voltage applied to them. These are shown in white and are indicated by reference numeral 404. It will be appreciated that this setup can detect vertical and diagonal shorts.

Thus in just two steps or tests all of the I/Os can be tested for short circuits with adjacent I/Os. This approach is applicable to all matrix-type packages like micro SMD and BGA, and also to multi-row and column inline packages like high-pin-count Leadless Lead-frame Packages (LLP). It will be appreciated that by reducing the number of tests or iterations to just two iterations for the short circuit testing of adjacent I/Os, the test time is considerably reduced. In fact, it is possible to keep this test time down to only tens of milliseconds regardless of the number of I/Os.

In practice, an additional consideration has to be borne in mind. Care has to be taken to avoid applying a voltage to internally grounded pins. Such pins serve as a voltage reference and by reverse biasing them damage may be caused to the internal devices. This will be discussed in greater detail below and causes some additional test time for the special setups needed to take care of the internally grounded I/Os.

Figure 5:
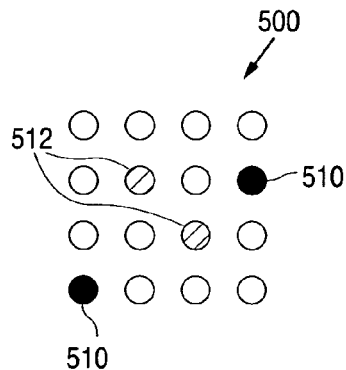
FIG. 5 shows ground I/Os and power supply I/Os for one embodiment of a micro SMD IC.

The additional considerations are best understood by again considering a 16 I/O micro SMD IC. FIG. 5 shows such an IC 500 with two ground pins 510 (shown in black) and two supply pins 512 (shown hached). The ground pins 510 are typically internally connected to each other, and the supply pins 512 are typically also electrically connected internally. Thus, whenever any ground pin 510 is forced to ground potential, all other grounds are also forced to zero. In this example, forcing either of the two ground pins 510 to zero will cause the other ground pin 510 also to be forced to zero. Similarly, forcing either of the two power supply pins 512 to zero will cause the other power supply pin 512 also to be forced to zero.

Figure 6:
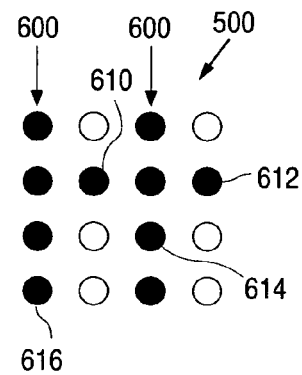
FIGS. 6 and 7 depict two steps of one embodiment of the invention, taking into account ground and power supply I/Os.

Thus in one of the two main steps performed on the IC of FIG. 5, involving the grounding of alternate columns, the resulting pattern will look as shown in FIG. 6, where the grounded I/Os are shown in black and the tested I/Os are shown in white. In addition to the columns 600 being grounded, the power supply pin 610 and ground pin 612 are also grounded. The power supply pin 610 is grounded since it is internally connected to power supply pin 614, which falls within one of the columns 600. In the case of the ground pin 612, not only is it internally connected to the ground pin 616, which falls within one of the grounded columns 600, all ground pins are forced to a ground potential in any event in order to preserve the internal grounds 612, 616 as ground voltage references.

Figure 7:
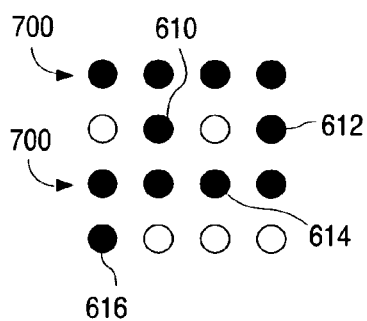

In the other main step performed on the IC of FIG. 5, involving the grounding of alternate rows, the resulting pattern will look as shown in FIG. 7, where the grounded I/Os are shown in black and the tested I/Os are shown in white. Again, in addition to the two rows 700 being grounded, the power supply pin 610 and ground pin 612 are grounded. The power supply pin 610 is grounded because it is internally connected to power supply pin 614, which falls within one of the rows 700. In the case of the ground pins 612, 616 they are shown as grounded since all ground pins are forced to a ground potential in order to preserve the internal grounds as ground voltage references.

It will, therefore, be appreciated that some of the adjacent I/Os are forced to a ground potential and that they cannot be tested for a short circuit in the two main steps discussed above with respect to FIGS. 6 and 7, respectively.

Figure 8:
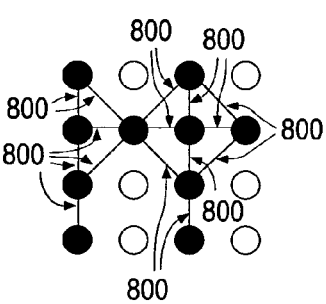
FIGS. 8 and 9 show FIGS. 6 and 7 and showing untestable or inadequately testable short circuits for each of the two steps.
Figure 9:
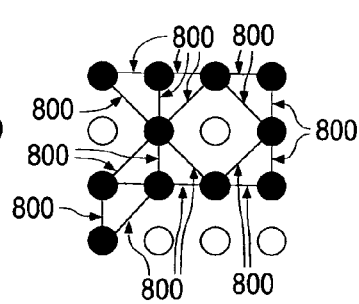

For greater clarity, FIGS. 8 and 9 show, by way of links 800, the potential short circuits between adjacent I/Os that cannot be tested in the two main steps of FIGS. 6 and 7, respectively. It will be appreciated that some of the links in the first main step are taken care of (not linked) in the second main step. Similarly, some of the links in the second main step are taken care of (not linked) in the first main step. Thus only the links appearing in both FIGS. 8 and 9 present a problem in that these are untested potential short circuits. These are identified in the present embodiment by using Boolean logic comprising performing an AND operation on the I/Os in FIGS. 8 and 9, wherein the black I/Os represent logic 0, and the white I/Os represent logic 1. The result of such an AND operation is shown in FIG. 10.

It will, however, be appreciated that if a parallel continuity test is also performed, the number of I/Os that cannot be adequately tested is further reduced. This is because any ground I/Os would present a voltage drop to the ATE if there is a short to an adjacent pin. Therefore, any predefined voltage drop on a tested I/O adjacent to a ground I/O would mean either an internal short on the tested I/O or a short to the ground I/O. Either of these effects would require rejection of the IC. The final I/Os that are not testable for a short circuit to an adjacent pin can therefore be logically determined by performing an XOR operation on the I/Os of FIG. 10 with the ground I/O as shown in FIG. 11.

Figure 10:
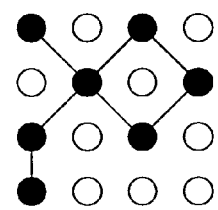
FIG. 10 shows the untestable or inadequately testable short circuits when the steps of FIGS. 6 and 7 are combined.
Figure 11:
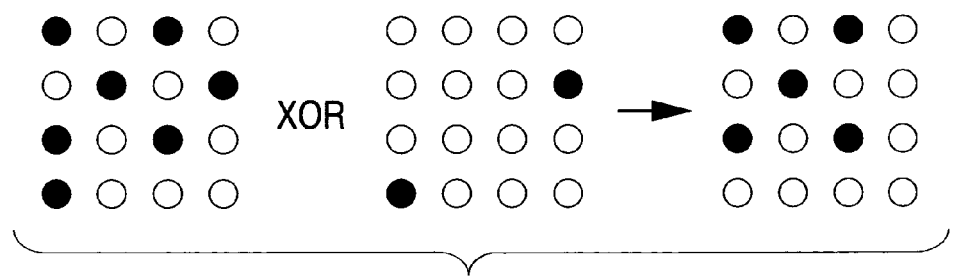
FIG. 11 shows the untestable or inadequately testable short circuits when the steps of FIGS. 6 and 7 are combined with a parallel continuity test.
Figure 12:
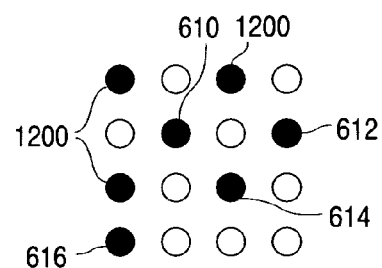
FIG. 12 shows a third testing step on the IC of FIG. 5.

In order to test for short circuits to adjacent pins for the pins identified in FIG. 10 (which for reasons of simplicity will be referred to as untested or inadequately tested I/Os), a third step is performed in which all power supply I/Os and all ground I/Os are forced to ground potential and the other untested I/Os other than the power supply and ground I/Os are tested. This is shown in FIG. 12 in which all black I/Os are the untested I/Os from FIG. 10. However, the ground I/Os 612, 616 and power supply I/Os 610, 614 are forced to a ground potential thus allowing the remaining I/Os 1200 to be tested.

As mentioned above, the order of the tests or steps is unimportant. Also, if only the issue of short circuits between adjacent pins is to be considered, the parallel continuity test is not necessary. In such a case only the steps defined above as the first, second and third steps need to be performed. The AND operation discussed above serves purely to identify the I/Os that are not testable using only the first and second steps. The XOR operation serves to identify the I/Os that are not testable even when the parallel continuity test is also included in the method as an additional test step.

While the present invention has been described with respect to a specific embodiment, the invention is not limited to a particular IC structure or ATE type nor to any particular method of analyzing untestable I/Os but covers a method involving any structure and approach as defined by the claims.

What is claimed is:

1. A method of testing for short circuits between adjacent I/Os of an IC, comprising:
   grounding alternate columns of I/Os of an IC and applying current to the other I/Os that are not ground I/Os, in a first step,
   in a second step, grounding alternate rows of I/Os of the IC and applying current to the other I/Os that are not ground I/Os, and
   during both the first and second steps, checking a voltage on the I/Os to which current is applied.

2. A method of claim 1, wherein the voltage on the I/Os to which current is applied is typically monitored for a low voltage.

3. A method of claim 2, wherein the low voltage is a predefined low voltage or substantially 0V.

4. A method of claim 1, further comprising a third step involving a parallel continuity test step for testing the I/Os for internal open circuits or short circuits.

5. A method of claim 1, wherein during the first and second steps the ground I/Os are not forced to a higher potential than other I/Os.

6. A method of claim 4, wherein during the each step the ground I/Os are not forced to a higher potential than other I/Os.

7. A method of claim 5, wherein all ground I/Os are forced to a ground potential.

8. A method of claim 6, wherein all ground I/Os are forced to a ground potential.

9. A method of claim 7, further comprising defining grounded I/Os as logic 0 and tested I/Os as logic 1, and performing an analysis step comprising an AND operation on the I/Os of the IC for the first and second steps, to determine which I/Os cannot be adequately tested for short circuits to adjacent I/Os during the first and second steps.

10. A method of claim 9, further comprising testing said I/Os that cannot be adequately tested during the first and second steps by forcing any power supply and ground I/Os to ground potential and testing, in a third step involving a parallel continuity test step for testing the I/Os for internal open circuits or short circuits, the remaining ones of said I/Os that cannot be adequately tested in the first and second steps.

11. A method of claim 8, further comprising defining grounded I/Os as logic 0 and tested I/Os as logic 1, and performing a first analysis step comprising an AND operation on the I/Os of the IC for the first and second step, to determine which I/Os cannot be adequately tested for short circuits to adjacent I/Os during the first and second steps.

12. A method of claim 11, further comprising testing said I/Os that cannot be adequately tested during the first and second steps by forcing any power supply and ground I/Os to ground potential and, in the third step, testing the remaining ones of said I/Os that cannot be adequately tested in the first and second steps.

13. A method of claim 12, further comprising a second analysis step, involving defining grounded I/O as logic 0 and tested I/Os as logic 1, and performing an XOR operation on the results of the first analysis step and the ground I/Os.

* * * * *